United States Patent
Chen et al.

[11] Patent Number: 6,053,049
[45] Date of Patent: Apr. 25, 2000

[54] ELECTRICAL DEVICE HAVING ATMOSPHERIC ISOLATION

[75] Inventors: Chiu Chik Chen, Lincolnwood; Christopher J. Hoyle, Evanston; Robert C. Kosberg, Wildwood; Keith A. Meny, Wheeling; Lawrence R. Poglitsch, Mt. Prospect; James Nowicki, Jr., Chicago, all of Ill.

[73] Assignee: Motorola Inc., Schaumburg, Ill.

[21] Appl. No.: 08/865,956

[22] Filed: May 30, 1997

[51] Int. Cl.[7] .................................................. G01L 7/00
[52] U.S. Cl. ............................................................ 73/756
[58] Field of Search ........................... 73/756, 721, 727; 439/76.1, 519, 620; 361/600, 679

[56] References Cited

U.S. PATENT DOCUMENTS

| | | | |
|---|---|---|---|
| 4,120,913 | 10/1978 | Petrie ........................................ | 525/524 |
| 4,295,117 | 10/1981 | Lake et al. ............................. | 73/727 X |
| 4,647,138 | 3/1987 | Muz ......................................... | 439/620 |
| 4,720,155 | 1/1988 | Schildkraut et al. ................ | 439/620 X |
| 4,838,089 | 6/1989 | Okada et al. .......................... | 73/756 X |
| 4,850,227 | 7/1989 | Luettgen et al. ....................... | 73/756 X |
| 5,014,557 | 5/1991 | Lawless .................................. | 73/756 |
| 5,090,919 | 2/1992 | Tsuji ....................................... | 439/519 |
| 5,096,427 | 3/1992 | Sadigh-Behzadi .................... | 439/76.1 |
| 5,693,887 | 12/1997 | Englund et al. ...................... | 73/756 X |
| 5,703,296 | 12/1997 | Little et al. ............................. | 73/756 |

*Primary Examiner*—William Oen
*Attorney, Agent, or Firm*—Gary J. Cunningham

[57] ABSTRACT

An electrical device (10) includes a package body (12) having a device mounting region (14) and an electrical connection region (16). A cavity (18) resides in the package body (12) intermediate to the device mounting region (14) and to the electrical connection region (16). A leadframe (20) is positioned within the package body (12) and includes a plurality of individual leads (34) traversing the cavity (18). An electronic component (24) is electrically attached to the individual leads (34) within the cavity (18). In addition to accommodating the attachment of the electronic component (24), the cavity (18) is configured to permit access to the individual leads (34) by a bonding tool (40).

24 Claims, 4 Drawing Sheets

ELECTRICAL DEVICE HAVING ATMOSPHERIC ISOLATION

CROSS REFERENCE TO RELATED APPLICATION

Related subject matter is disclosed in copending, commonly assigned patent application having Ser. No. 08/688,979 and filing date, Jun. 31, 1996.

FIELD OF THE INVENTION

This invention relates, in general, to electrical devices, and more particularly, to electrical devices containing multiple regions for performing independent electrical functions.

BACKGROUND OF THE INVENTION

Electrical devices containing multiple regions for the performance of different electrical functions are common in the field of automotive sensors. Typically, a region containing a sensing element is exposed to some type of corrosive environment. For example, pressure sensors incorporated in automotive subsystems can be exposed to corrosive gases within, for example, an exhaust manifold. In other applications, sensors can be exposed to corrosive liquid environments. For example, sensors can be submerged in automotive fluids, such as power steering fluid, engine lubricating oils, and the like. While the electronic device must function in a corrosive environment, it is also necessary that the electrical device be connected to external electronic circuitry. The external circuitry sends and receives electrical signals to and from the electrical device. To avoid corrosion of electrical connections, the portion of the device exposed to the corrosive environment must be effectively isolated from the portion of the device in which external electrical connections are made.

In addition to the need for internal isolation of the various regions of an electrical device, during fabrication thermal processing steps are carried out to form electrical connections within the electrical device. For example, sensing elements are usually wire bonded to a leadframe position within the electrical device. The formation of reliable wire bond connections requires that the electrical device be subjected to elevated temperatures during the bonding operation. Typically, the elevated temperatures necessary to form the wirebonds are achieved by heating the entire electrical device, including the housing and internal components. Because of the large thermal mass, the heating of the housing and internal components is costly and takes an extended period of time in order to reach the desired temperature. The elevated temperatures can soften the molded plastic material used to fabricate structural components of the electronic device. Additionally, at high temperature the plastic housing material can flow. The flow of plastic can coat bonding areas of the leadframe with an insulative plastic layer. The plastic layer hinders the formation of electrical connections to the leadframe. In addition, the flow of plastic can result in undesirable deformation of the electrical device housing.

Existing electrical devices require multiple sealing locations in order to achieve sufficient environmental protection required for applications in corrosive environments. To form the multiple seals, custom dispensing operations are necessary to provide sealant at several locations within the device housing. Accordingly, a need existed for an electrical device having an improved means for sealing and atmospherically isolating various regions within the device housing. Additionally, a need existed for an improved electrical device design, in which electrical connections can be reliably formed without compromising the integrity of the electrical device.

Figure 1:
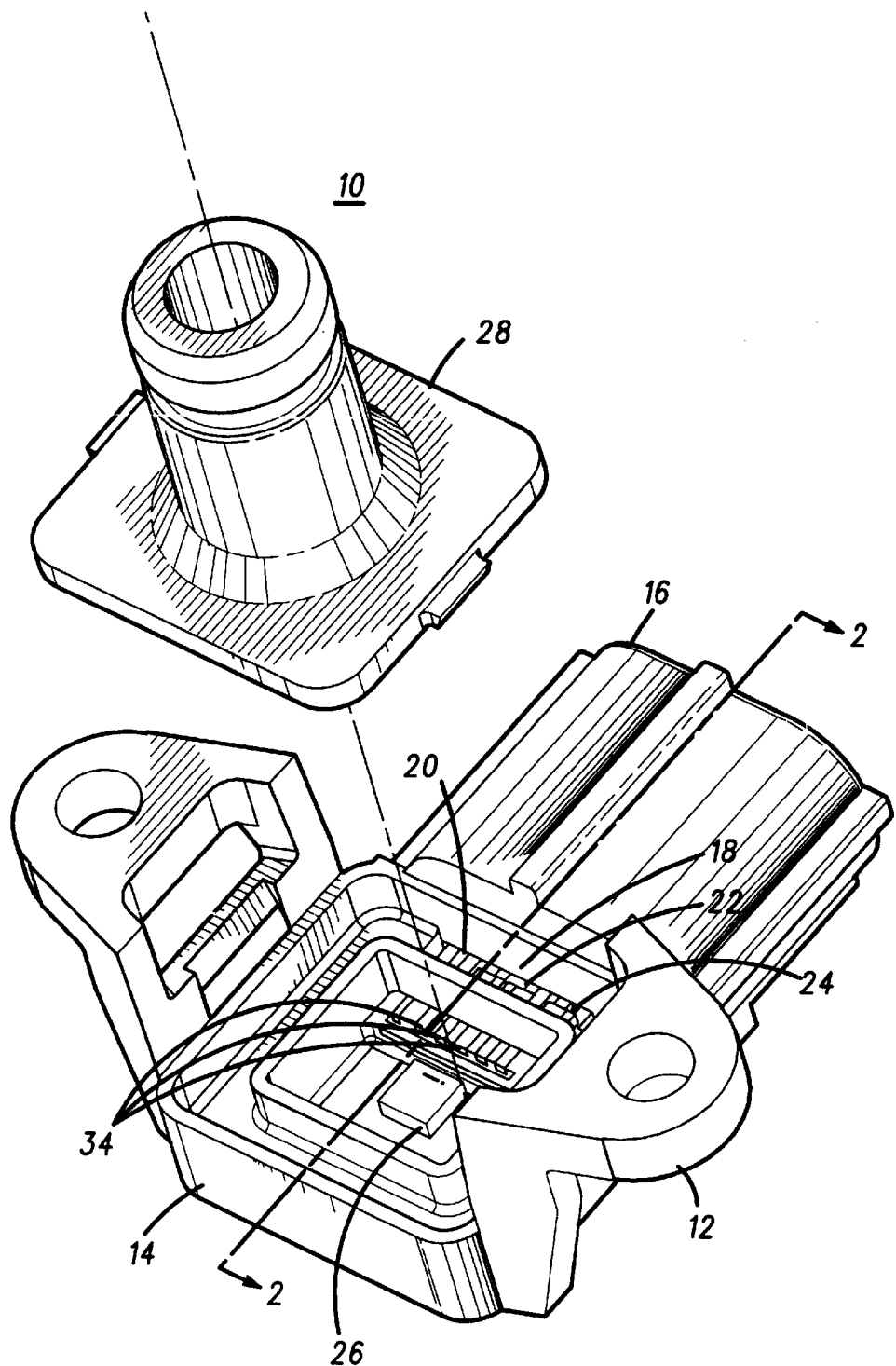
FIG. 1 is an exploded perspective view of an electrical device arranged in accordance with one embodiment of the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for an electrical device having two distinct regions, where each region is geometrically constructed to carry out a distinct electrical function. The inventive electrical device includes a cavity intermediate to the separate regions. The cavity is configured to permit the introduction of sealant compounds into the cavity for atmospherically isolating the different regions of the electrical device. Additionally, the interior cavity is arranged to permit the placement of an electronic component onto a leadframe traversing the cavity. Furthermore, the cavity is arranged to permit contact by a bonding tool to a portion of the leadframe traversing the cavity. Thermal contact through a portion of the leadframe within the cavity facilitates the electrical connection of a sensing element located in one region of the electrical device to the leadframe. The electrical device of the invention provides improved electrical assembly and reliability for electrical devices containing multiple regions, where each performs a different electrical function.

FIG. 1 illustrates an exploded perspective view of an electrical device 10 arranged in accordance with one embodiment of the invention. A package body 12 includes a device mounting region 14 and an electrical connection region 16. A cavity 18 is located in package body 12 and resides intermediate to device mounting region 14 and electrical connection region 16. A leadframe 20 is mounted within package body 12, such that a leadframe portion 22 traverses cavity 18. An electronic component 24 is mounted to leadframe portion 22 within cavity 18. A sensing element 26 resides within device mounting region 14 of package body 12 and is electrically connected to leadframe 20. A cover 28 is positioned over device mounting region 14 to provide an interior chamber surrounding sensing element 26.

Figure 2:
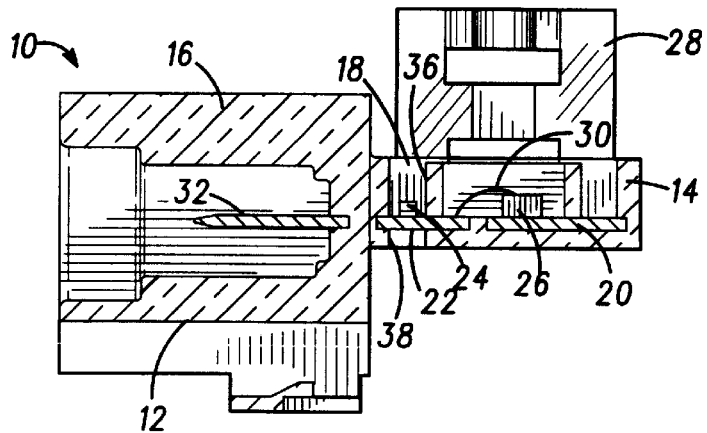
FIG. 2 is a cross-sectional view of the device illustrated in FIG. 1 taken along section line 2—2.

FIG. 2 illustrates a cross-sectional view of electronic device 10 taken along section line 2—2 of FIG. 1. Sensing element 26 is positioned on leadframe 20 and electrically coupled to leadframe 20 by wirebonds 30. Lead frame 20 extends through cavity 18 and into electrical connection region 16 of package body 12. Lead frame terminations 32 are positioned within electrical connection region 16 to permit the electrical coupling of electrical device 10 to external electronic circuitry (not shown).

The present invention contemplates the operation of electrical device 10 to perform a wide variety of functions, such as pressure sensing, gas sensing, thermal measurements, and the like. Accordingly, sensing element 26 and electrical component 24 can perform different electronic functions depending upon the particular application of electrical device 10. For example, sensing element 26 can be a piezoelectric transducer, or a thermistor, or the like. In accordance with the particular electronic function performed by sensing element 26, electronic component 24 can be a resistor, or a capacitor, or the like.

As shown in FIGS. 1 and 2, leadframe 20 includes a plurality of individual leads 34. The individual leads pass into and out of cavity 18 through first and second interface regions 36 and 38, respectively. To atmospherically isolate device mounting region 14 from electrical connection region 16, cavity 18 can be filled with a sealant. In particular, at a minimum, the sealant is placed around each of the individual leads 34 at first and second interface regions 36 and 38. Depending upon the particular application, the cavity can be entirely filled with a sealant by injecting the sealant into cavity 18. The particular sealant can be a silicon-based potting compound, an epoxy resin, a thermal-plastic material, and the like. The sealant functions to prevent liquids and gases from migrating along leadframe 20 and entering or leaving device mounting region 14 and electrical connection region 16. In addition to being filled with a sealant, cavity 18 can also contain a gaseous media, in which the gaseous media is different from the atmosphere within device mounting region 14, or electrical connection region 16. For example, the gaseous media within cavity 18 can be an inert gas, such as nitrogen, argon, and the like.

Figure 3:
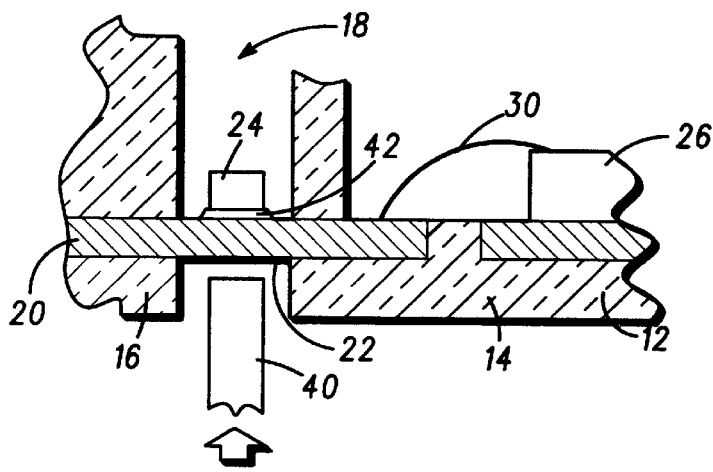
FIG. 3 is an exploded view of a portion of the cross-sectional view shown in FIG. 2.

An enlarged view of a portion of electrical device 10 is illustrated in FIG. 3. During the assembly of electrical device 10, sensing element 26 is electrically coupled to leadframe 20 by attaching wirebonds 30 to bonding pads (shown in FIG. 4) located on both sensing element 26 and leadframe 20. The attachment of wirebonds 30 to leadframe 20 is facilitated by inserting a bonding tool 40 into cavity 18 of package body 12. Bonding tool 40 transmits bonding energy to leadframe portion 22 traversing cavity 18. The bonding energy provided by bonding tool 40 dissipates through leadframe 20 raising the temperature of leadframe 20. Bonding tool 40 can be one of a number of different bonding tools employing different mechanisms for transferring bonding energy to leadframe 20. For example, bonding tool 40 can be an electrical energy bonding tool, a laser energy bonding tool, a photonic energy bonding tool, an ultrasonic bonding tool, and the like. The elevated temperature of leadframe 20 assists in forming a reliable electrical connection between wirebonds 30 and leadframe 20. As will subsequently be described, bonding tool 40 selectively heats leadframe 20, while not raising the temperature of remaining portions of electrical device 10.

Figure 4:
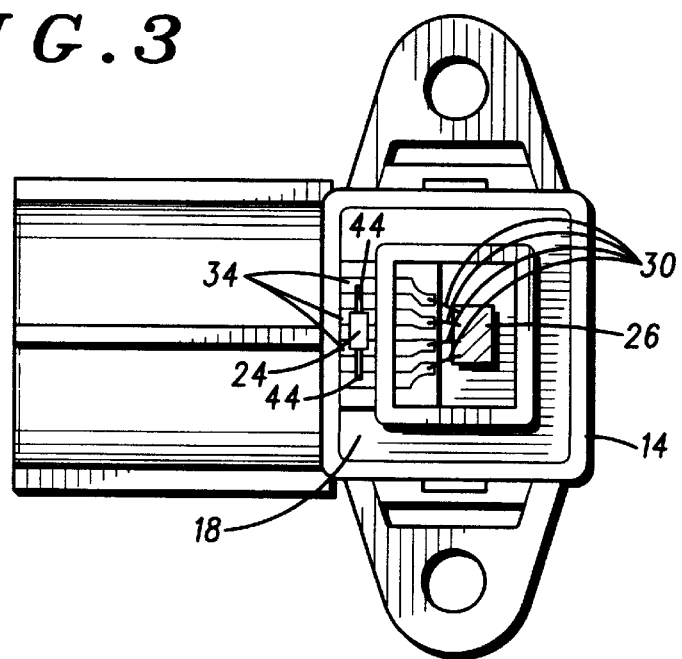
FIG. 4 is a partial top view of the electrical device shown in FIG. 1.

Electronic component 24 is mounted to leadframe 20 within cavity 18 by a bonding compound 42. In accordance with that invention, electronic component 24 can be one of a number of different types of electronic components. The different electronic components can have varying geometric configurations, where each geometric configuration requires a unique electrical connection technique. For example, FIG. 4 illustrates a top view of a portion of device mounting region 14, in which electronic component 24 is mounted transverse to individual Leads 34. Electronic component 24 is electrically connected to individual leads 34 of leadframe 20 by connection leads 44.

Figure 5:
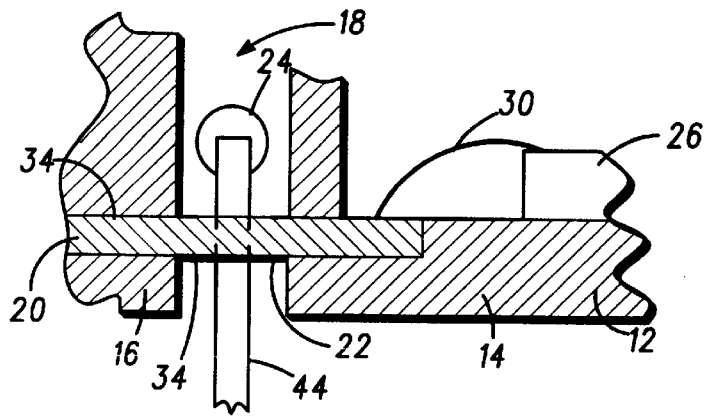
FIGS. 5–7 illustrate, in cross-section, different embodiments for attachment of an electronic component in accordance with the invention.
Figure 6:
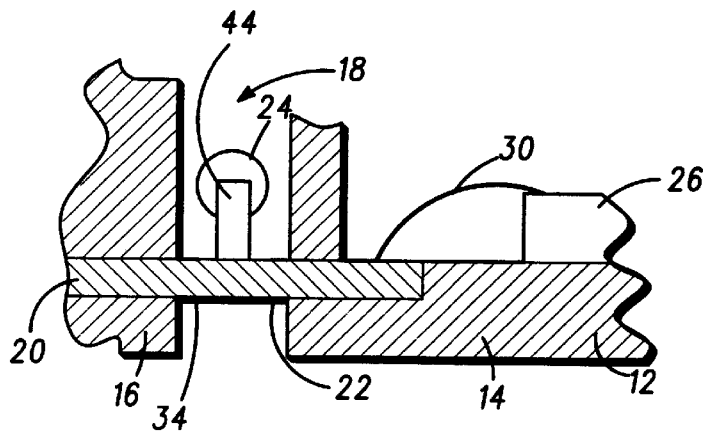

As shown by the cross-section view of FIG. 5, connection leads 44 of electronic component 24 can extend through openings in individual leads 34. In another embodiment of the invention, connection leads 44 of electronic component 24 can be surface mounted to individual leads 34 of leadframe 20, as illustrated in FIG. 6. The surface mount connection is accomplished in an analogous manner to the attachment illustrated in FIG. 3 for a leadless electronic component.

Figure 7:
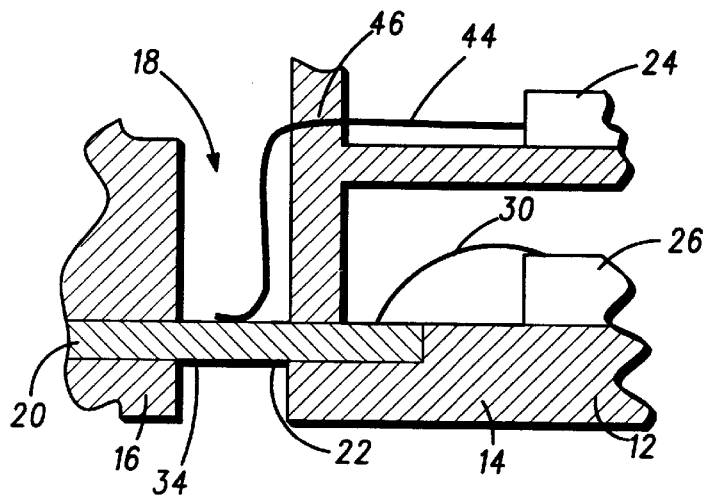

FIG. 7 illustrates yet another embodiment of the invention. Electronic component 24 is mounted to a portion of package body 12 external to cavity 18. Connection leads 44 extend through a wall portion 46 of package body 12 and into cavity 18. Package leads 44 are bonded to individual leads 34 of leadframe 20 in cavity 18. In accordance with the embodiment illustrated in FIG. 7, the present invention contemplates the placement of electronic component 24 in region package body 12 adjacent to cavity 18. Those skilled in the art will recognize that electronic component 24 can also be mounted within electrical connection region 16 of package body 12. Furthermore, in another aspect of the invention, bonding tool 40 can provide thermal energy for bonding connection leads 44 to individual leads 34 of leadframe 20.

Figure 8:
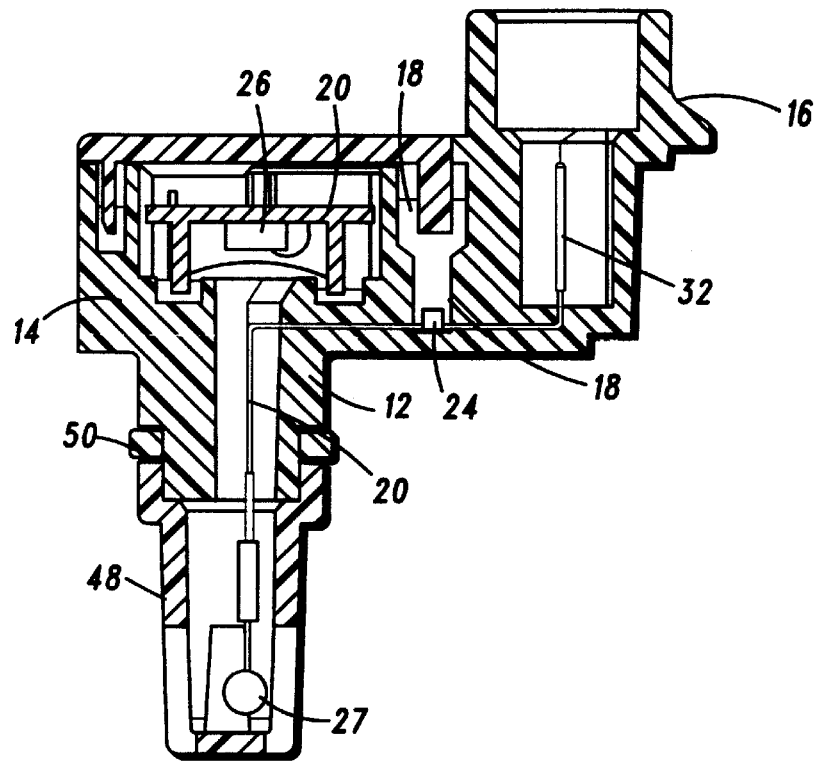
FIG. 8 illustrates, in cross-section, another embodiment of the invention employing multiple sensing elements.

FIG. 8 illustrates, in cross-section, an embodiment of the invention including multiple sensing elements, including a temperature sensing apparatus. A thermistor 27 is located within a thermistor cage 48. Thermistor cage 48 is attached to device mounting region 14 of package body 12 and sealed by an O-ring 50. Leadframe 20 electrically couples the thermistor sensing element to leadframe terminations 32 located in electrical connection region 16 of package body 12. Sensing element 26 is bonded to leadframe 20 in device mounting region 14 above thermistor cage 48. Leadframe 20 extends through cavity 18, where electronic component 24 is mounted to leadframe 20.

The embodiment shown in FIG. 8 illustrates an aspect of the present invention where multiple sensing elements can be housed in device mounting region 14. Further, the multiple sensing elements can be connected to different portions of a leadframe passing through cavity 18. Those skilled in the art will appreciate that other variations are possible, including the mounting of additional elements in device mounting region 14 and connecting the additional elements to leadframe 20.

Figure 9:
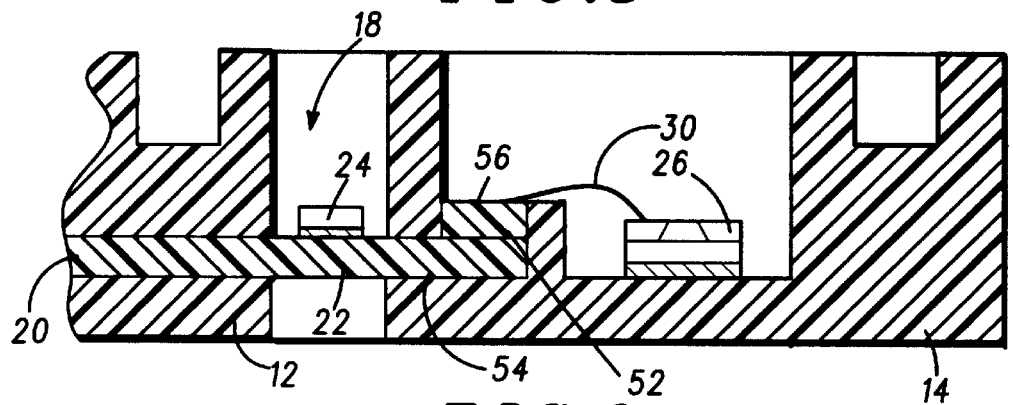
FIG. 9 is a partial cross-sectional view of the electrical device shown in FIG. 1 illustrating yet another embodiment of the invention.

FIG. 9 illustrates a partial cross-sectional view of FIG. 1 showing yet another embodiment of the invention, in which device mounting region 14 includes a second cavity 52. Leadframe terminations 54 reside at the bottom of second cavity 54 and can be submerged in a sealant 56. Wirebonds 30 extend into second cavity 52 and are attached to leadframe terminations 54.

Second cavity 52, when filled with sealant 56, can prevent air and other gases from migrating along leadframe 32 and escaping into device mounting region 14 of package body 12. If air bubbles emerge in device mounting region 14, they can fatigue wirebonds 30 causing premature electrical failure of electrical device 10. Additionally, it is often undesirable to have air leaking into the vicinity of sensing element 26. Preferably, sealant 56 is a potting compound that is resistant to air, but does not disturb wirebonds 30.

Figure 10:
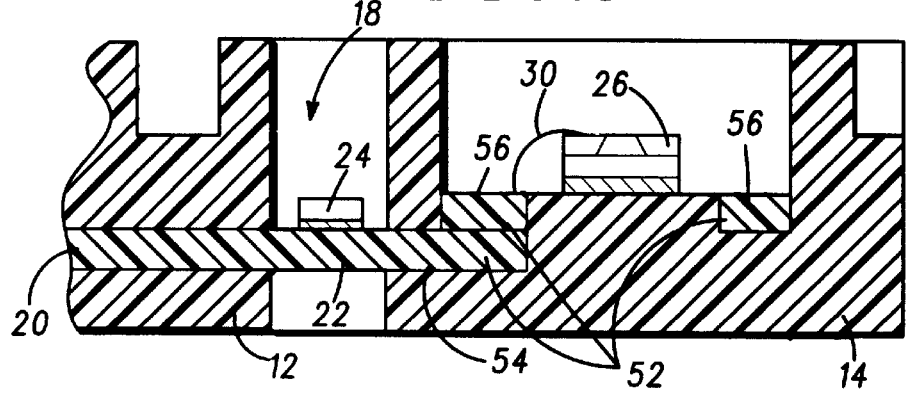
FIG. 10 is a partial cross-sectional view of the electrical device shown in FIG. 1 illustrating still further embodiment of the invention.

In a still further embodiment of the invention illustrated in FIG. 10, second cavity 52 is extended within device mounting region 14 to completely surround sensing element 26. In this manner, sensing element 52 is further protected from exposure to air entering device mounting region 14 from leadframe 23.

Those skilled in the art will recognize that the configuration of cavity 18 to permit thermal contact by bonding tool 40 offers numerous process advantages for fabrication of the inventive electrical device. For example, where package body 12 is an insert molded plastic material, the configuration of cavity 18 permits leadframe 20 to be stabilized during the insert molding process. By stabilizing leadframe 20 during molding, the potential for flashing of plastic over the wire bonding surface of leadframe 20 is minimized. Additionally, in comparison with techniques of the prior art, the wire bonding process to electrically connect sensing element 26 to leadframe 20 can be carried out at a lower temperature. This is because it is unnecessary to heat the entire device to provide the necessary temperature for wire bonding.

The configuration of cavity 18 to permit thermal contact by bonding tool 40 selectively places the heat needed for wire bonding into the leadframe itself. Accordingly, other elements present in the electrical device do not experience high temperatures during the wire bonding process. The direct application of heat to leadframe 20 improves the manufacturing process and reduces failure of sensing elements and other components caused by excess thermal processing.

Thus it is apparent that there has been provided, in accordance with the invention, an electrical device having atmospheric isolation, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different sealant materials can be used in different locations within the device. It is therefore intended to include within the invention all such variations and modifications as fall within the scope of the appended claims and equivalents thereof.

We claim:

1. An electrical device comprising:
   a package body having a device mounting region and an electrical connection region and a cavity intermediate to the device mounting region and the electrical connection region;
   a leadframe positioned in the device mounting region and the electrical connection region and traversing the cavity, wherein the cavity exposes a bonding surface of the leadframe and a thermal contact region opposite the bonding surface, and;
   a sensing element located in the device mounting region and electrically connected to the bonding surface of the leadframe;
   an electronic component located in the cavity and electrically connected to the leadframe,
   wherein the cavity is configured to permit access by a bonding tool to physically contact the thermal contact region and to electrically attach the sensing element to the leadframe; and
   leadframe terminations within the electrical connection region for electrically coupling the electrical device to external electronic circuitry.

2. The electrical device of claim 1, wherein the cavity is filled with a gaseous media.

3. The electrical device of claim 1, wherein the cavity is filled with a sealant selected from the group consisting of a silicon-based potting compound, an epoxy resin, and a thermoplastic material.

4. The electrical device of claim 1, wherein the electronic component is a device selected from the group consisting of a resistor and a capacitor.

5. The electrical device of claim 1, wherein the leadframe comprises a plurality of individual leads traversing at least a portion of the cavity.

6. The electrical device of claim 5 further comprising:
   first and second interface regions located in the cavity where the plurality of individual leads enter the device mounting region and the electrical connection region, respectively; and
   a sealant at each of the first and second interface regions and surrounding each of the plurality of individual leads.

7. An electrical device comprising:
   a package body having a device mounting region and an electrical connection region and a cavity intermediate to the device mounting region and the electrical connection region;
   package leads extending across the cavity, wherein the package leads have a first surface opposite from a second surface; and
   an electronic component attached to the first surface of the package leads by bonds positioned in the cavity, the electrical component having electrical coupling means for attaching the electrical component to the package leads,
   wherein the cavity is configure so as to provide an opening opposite to electronic component to permit access to the second surface of the package leads by a bonding tool.

8. The electrical device of claim 7 further comprising sealing means for sealing the package leads to the device mounting region and to the electrical connection region.

9. The electrical device of claim 8, wherein the sealing means comprises a cured adhesive.

10. The electrical device of claim 7, wherein the cavity is filled with a gaseous media.

11. The electrical device of claim 7, wherein the cavity is filled with a sealant selected from the group consisting of a silicon-based potting compound, an epoxy resin, and a thermoplastic material.

12. The electrical device of claim 7 further comprising a sensing element mounted within the device mounting region.

13. The electrical device of claim 7, wherein the package leads further comprise terminations within the electrical connection region for electrically coupling the electrical device to external electronic circuitry.

14. The electrical device of claim 7, wherein the electronic component is a device selected from the group consisting of a resistor and a capacitor.

15. An electrical device comprising:
a package body having a device mounting region and an electrical connection region and a cavity intermediate to the device mounting region and the electrical connection region;
a leadframe positioned in the device mounting region and the electrical connection region and traversing the cavity,
wherein the leadframe includes a plurality of individual leads;
first and second interface regions located in the cavity where the plurality of individual leads enter the device mounting region and the electrical connection region, respectively;
a sealant at each of the first and second interface regions and surrounding each of the plurality of individual leads; and
an electrical component located in the cavity and mounted to an upper surface of the leadframe,
wherein the cavity is configured to permit contact to a lower surface of the package leads by a bonding tool.

16. The electrical device of claim 15 further comprising:
a sensing element in the device mounting region; and
electrical attachment means for electrically attaching the sensing element to the leadframe,
wherein the electrical attachment means is bonded to the upper surface of the leadframe by thermal energy applied to the lower surface of the leadframe at a position where the leadframe traverses the cavity.

17. The electrical device of claim 16, wherein the sensing element is selected from the group consisting of a piezoelectric transducer and a thermistor.

18. The electrical device of claim 15, wherein the cavity is filled with a gaseous media.

19. The electrical device of claim 15, wherein the cavity is filled with a sealant selected from the group consisting of a silicon-based potting compound, an epoxy resin, and a thermo-plastic material.

20. The electrical device of claim 15, wherein the electrical component is a device selected from the group consisting of a resistor and a capacitor.

21. An electrical device comprising:
a package body having a device mounting region and an electrical connection region and a cavity intermediate to the device mounting region and the electrical connection region;
a leadframe positioned in the device mounting region and the electrical connection region and traversing the cavity, wherein the cavity exposes a bonding surface of the leadframe and a thermal contact region opposite the bonding region,
a plurality of sensing elements located in the device mounting region and electrically connected to the leadframe;
an electronic component located in the cavity and electrically connected to the leadframe,
wherein the cavity is configured to permit access to the thermal contact region by a bonding tool to electrically couple the sensing element to the bonding surface of the leadframe; and
leadframe terminations within the electrical connection region for electrically coupling the electrical device to external electronic circuitry.

22. The electrical device of claim 21, wherein the plurality sensing elements comprises at least one each of a piezoelectric transducer and a thermistor.

23. The electrical device of claim 21, wherein the electrical component is a device selected from the group consisting of a resistor and a capacitor.

24. The electrical device of claim 21 further comprising:
a sensing element mounted with the device mounting region;
a cavity within the device mounting region;
a sealant at least partially filling the cavity; and
wirebonds electrically connecting the sensing element to the leadframe,
wherein the wirebonds are at least partially submerged in the sealant.

* * * * *

UNITED STATES PATENT AND TRADEMARK OFFICE
CERTIFICATE OF CORRECTION

PATENT NO. : 6,053,049
DATED : April 25, 2000
INVENTOR(S) : Chen et al.

It is certified that error appears in the above-identified patent and that said Letters Patent is hereby corrected as shown below:

Column 6, line 15 reads "thermoplastic" should be -- thermo-plastic --.

Column 6, line 57 reads "thermoplastic" should be -- thermo-plastic --.

Column 8, line 30 reads "with the" should be -- within the --.

Signed and Sealed this

Seventeenth Day of April, 2001

*Attest:*

NICHOLAS P. GODICI

*Attesting Officer*   Acting Director of the United States Patent and Trademark Office